(12) United States Patent
Cho et al.

(10) Patent No.: US 7,371,071 B2
(45) Date of Patent: May 13, 2008

(54) CONNECTION STRUCTURE OF CIRCUIT SUBSTRATE

(75) Inventors: Sung-Dae Cho, Chungcheongnam-do (KR); Joo-Hyung Lee, Daegu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 412 days.

(21) Appl. No.: 10/877,752

(22) Filed: Jun. 25, 2004

(65) Prior Publication Data

US 2005/0016897 A1    Jan. 27, 2005

(30) Foreign Application Priority Data

Jul. 22, 2003    (KR) ...................... 10-2003-0050203

(51) Int. Cl.
*H01R 12/00* (2006.01)
(52) U.S. Cl. ........................................ 439/65; 439/885
(58) Field of Classification Search ................ 439/55, 439/885, 64, 65
See application file for complete search history.

(56) References Cited

U.S. PATENT DOCUMENTS 5,110,298 A * 5/1992 Dorinski et al. .............. 439/65
5,854,741 A 12/1998 Shim et al.

FOREIGN PATENT DOCUMENTS

GB 739828 * 2/1954
JP 06-156562 3/1994
JP 7-165260 6/1995
JP 09-012228 1/1997
JP 09-191021 7/1997
JP 2000-126665 5/2000
KR 1998-020175 6/1998
KR 1020010097634 11/2001
KR 20-0271836 3/2002
KR 1020020066820 8/2002

OTHER PUBLICATIONS

English language abstract of Japanese Publication No. 06-156562.
English language abstract of Japanese Publication No. 09-012228.
English language abstract of Japanese Publication No. 09-191021.
English language abstract of Japanese Publication No. 2000-126665.
English language abstract of Korean Publication No. 1020010097634.

(Continued)

*Primary Examiner*—Khiem Nguyen
(74) *Attorney, Agent, or Firm*—Marger Johnson & McCollom, P.C.

(57) ABSTRACT

The present invention provides an improved connection for circuit substrates. The circuit substrates are connected at concave and convex portions at their ends. The concave portion is formed such that the inside width is larger than the entrance width. The convex portion fits into the concave portion. Thereby, a connected portion of the circuit substrates has increased tensile strength. Furthermore, abnormality of the connected portion of the circuit substrates may be easily perceived.

14 Claims, 4 Drawing Sheets

OTHER PUBLICATIONS

English language abstract of Korean Publication No. 1020020066820.
English language abstract of Korean Publication No. 1998-020175.
English language abstract of Korean Publication No. 20-0271836.
English language abstract of Japanese Publication No. 7-165260.

* cited by examiner

CONNECTION STRUCTURE OF CIRCUIT SUBSTRATE

CROSS REFERENCE TO RELATED APPLICATIONS

This U.S. non-provisional application claims priority from Korean Patent Application No. 2003-50203 filed Jul. 22, 2003, the contents of which are incorporated by reference in their entirety.

BACKGROUND OF THE INVENTION

1. Field of the Invention

The present invention relates to semiconductor packages and, more particularly, to a connection structure for connecting circuit substrates.

2. Description of the Related Art

Integrated circuits (IC) have specific needs. Functionally, they require signal and power supplies. ICs can operate at high temperature and require heat dissipation. Furthermore, ICs damage easily by humidity, shock or thermal stress. Proper packaging satisfies these requirements.

In semiconductor package fabrication, circuit substrates or package substrates may use lead frames, printed circuit boards, ceramic substrates or tape wiring substrates. Strip-type circuit substrates may be used for simultaneous fabrication of a plurality of semiconductor packages. Single-type circuit substrates may be used for a single semiconductor package.

Tape wiring substrates and printed circuit boards may be flexible and thin, for example 150 µm to 200 µm thick, allowing the semiconductor packages to be fabricated with a reel-to-reel process. In a reel-to-reel process, the strip-type circuit substrates are wound on two reels and spaced at predetermined intervals and move from one reel to the other reel. The semiconductor package fabricating method using the reel-to-reel process allows mass production of packages, thereby increasing productivity. In conventional reel-to-reel processing, when a circuit substrate 10 ("a first circuit substrate") reaches its end, a new circuit substrate 20 ("a second circuit substrate") should be connected to the first circuit substrate 10). In general, the ends of the first and second circuit substrates 10, 20 are cut and connected to each other using an adhesive tape 30 to form a connected portion 40.

Currently, the connection between the circuit substrates 10 and 20 depends on the adhesive tape 30. The tensile strength of the connected portion 40 decreases considerably compared with an intact circuit substrate.

The reel-to-reel process occasionally deforms or otherwise damages the connected portion 40. Thus, a poorly connected portion may tear off at a tape feeder (not shown) or cause a jam.

Further, if the adhesive tape 30 expands, a gap between the first circuit substrate 10 and the second circuit substrate 20 occurs, causing a transfer fault. Specifically, the tape feeder utilizes guide holes formed on the circuit substrate at predetermined intervals and feeds the circuit substrate. If the adhesive tape 30 connecting the circuit substrates 10 and 20 expands abnormally, the guide holes in the connected portion 40 have irregular pitches, consequently generating the transfer fault. Evading detection with the naked eye, this expansion range of the adhesive tape 30 generally resides between 120 µm and 130 µm, as shown in FIG. 5.

SUMMARY OF THE INVENTION

The present invention is directed to an improved connection structure for a circuit substrate, improving the tensile strength of the connected substrates, thus preventing deformation or damage at the connected portion.

The present invention further allows easy detectability of abnormality in a connection structure of a circuit substrate.

In one embodiment, circuit substrates manufactured with complementary geometries may interlock with improved structural integrity. For instance, a first circuit substrate having at least one concave portion may interlock with a second circuit substrate having at least one convex portion. The concave portion may be formed with a larger inside width than the entrance width, therefore providing structural integrity against forces with components perpendicular to the substrate junction and planar with the substrates. The convex portion fits into the concave portion.

Numerous geometries can utilize the present invention so long as they are complementary in structure, thus strengthening the substrate connection based on their geometry.

BRIEF DESCRIPTION OF THE DRAWINGS

These and other objects, features and advantages of the present invention will be readily understood with reference to the following detailed description in conjunction with the accompanying drawings, wherein like reference numerals correspond to structural elements, and in which.

DETAILED DESCRIPTION OF THE INVENTION

Exemplary embodiments of the present invention will be described below with reference to the accompanying drawings.

Figure 1:
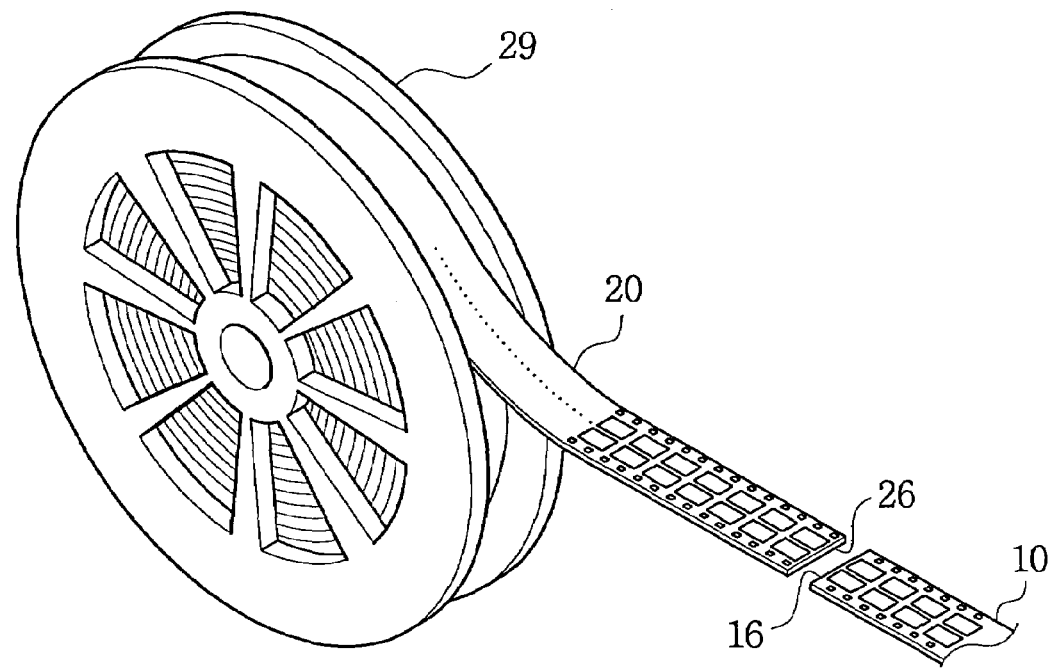
FIG. 1 is a perspective view illustrating a conventional connection for connecting circuit substrates.
Figure 2:
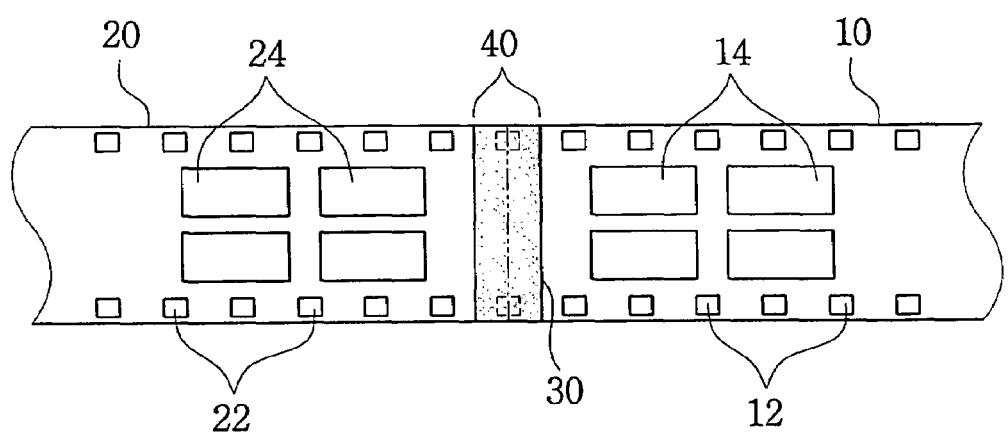
FIG. 2 is a plan view of the connection structure shown in FIG. 1.
Figure 3:
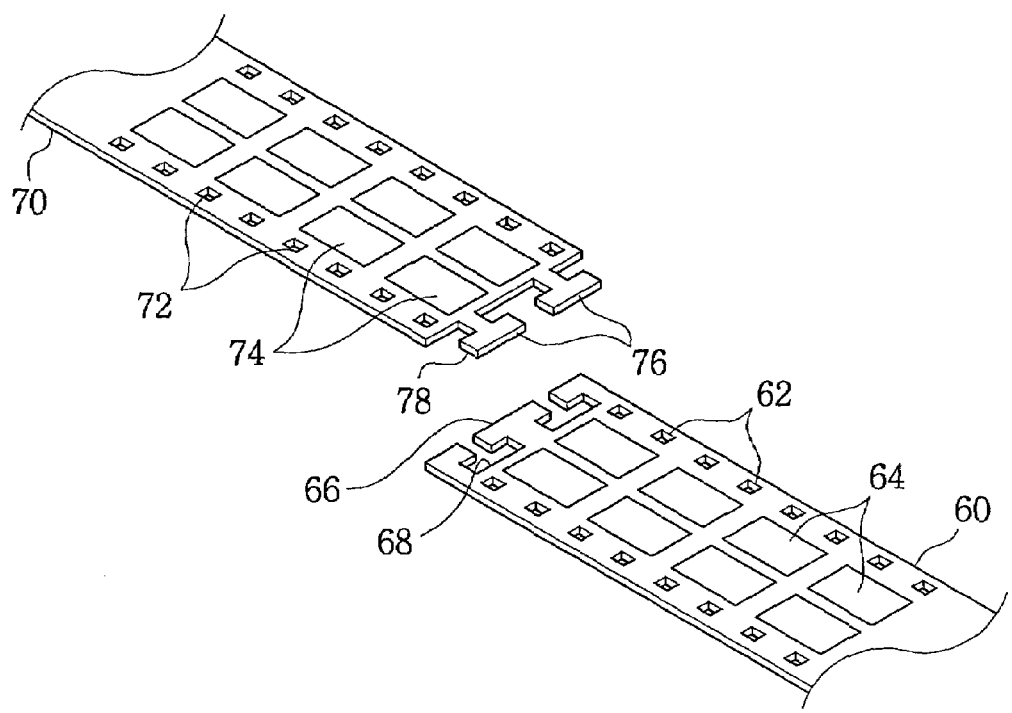
FIG. 3 is an exploded perspective view of one embodiment, illustrating a circuit substrate connection.
Figure 4:
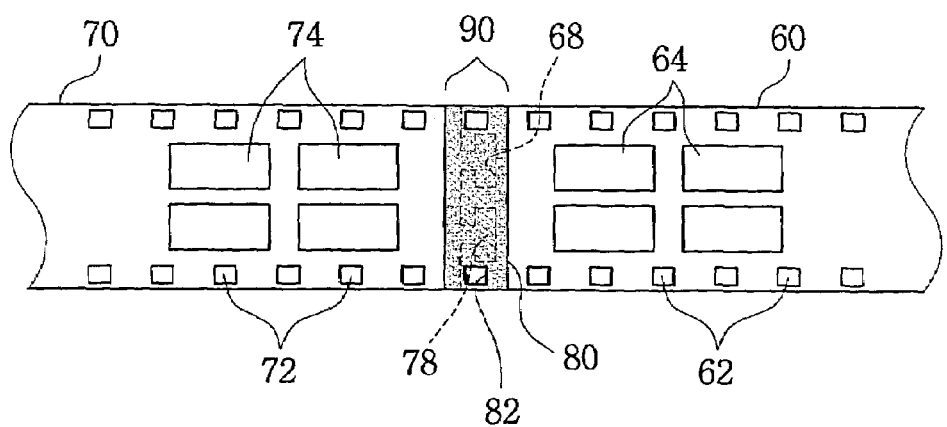
FIG. 4 is a plan view of a connection structure of FIG. 3.

FIG. 3 is an exploded perspective view illustrating a connection for circuit substrates in accordance with an embodiment of the present invention. FIG. 4 is a plan view of a connection structure shown in FIG. 3.

Referring to FIGS. 3 and 4, circuit substrates are connected in accordance with a T shaped embodiment of the present invention. The rear end 66 of a first circuit substrate 60 may be connected to the front end 76 of a second circuit substrate 70. An adhesive tape 80 may attach the connected ends of the first and second circuit substrates 60 and 70, thus securing the connected portion 90. Therefore, the connection structure geometry provides bonding strength for the connection structure in addition to the adhesive tape 80. This connection structure of circuit substrates improves bonding strength in comparison to conventional connection structures.

The first circuit substrate 60 preferably has a plurality of guide holes 62 at each side thereof, spaced at specified intervals. The first circuit substrate 60 may have package areas 64 spaced at specified intervals. In one embodiment, the first circuit substrate 60 preferably has at least one concave portion 68 at its end 66. The concave portion 68 may be formed with the inside width larger than the entrance width. In this embodiment, two concave portions are substantially of "T" shape and are spaced at predetermined intervals at the rear end of the first circuit substrate 60.

The second circuit substrate 70 may have a similar structure to the first circuit substrate 60. The second circuit substrate 70 preferably has at least one convex portion 78 at end 76. The convex portion 78 is substantially of "T" shape, corresponding to the concave portion 68 of the first circuit substrate 60 so that the convex portion 78 complements the concave portion 68.

The convex portion 78 of the second circuit substrate 70 interlocks with the concave portion 68 of the first circuit substrate 60, connecting the first circuit substrate 60 to the second circuit substrate 70. An adhesive tape 80 may attach to the rear end 66 of the first circuit substrate 60 and the front end 76 of the second circuit substrate 70, securing the connected portion. One embodiment provides dummy guide holes 82 at the adhesive tape area in conformity of intervals between the guide holes 62 and 72 of the first and second circuit substrates 60 and 70. Preferably, the length of the rear portion of the first circuit substrate 60 and the front portion of the second circuit substrate 70 may maintain the intervals of the guide holes 62 and 72. Alternatively, the dummy guide holes may not be formed.

Although this embodiment of the present invention shows the concave portion 68 formed at the rear end of the first circuit substrate 60 and the convex portion 78 formed at the front end of the second circuit substrate 70, the concave portion may be formed at the front end of the second circuit substrate 70 and the convex portion may be formed at the rear end of the first circuit substrate 60.

Figure 5:
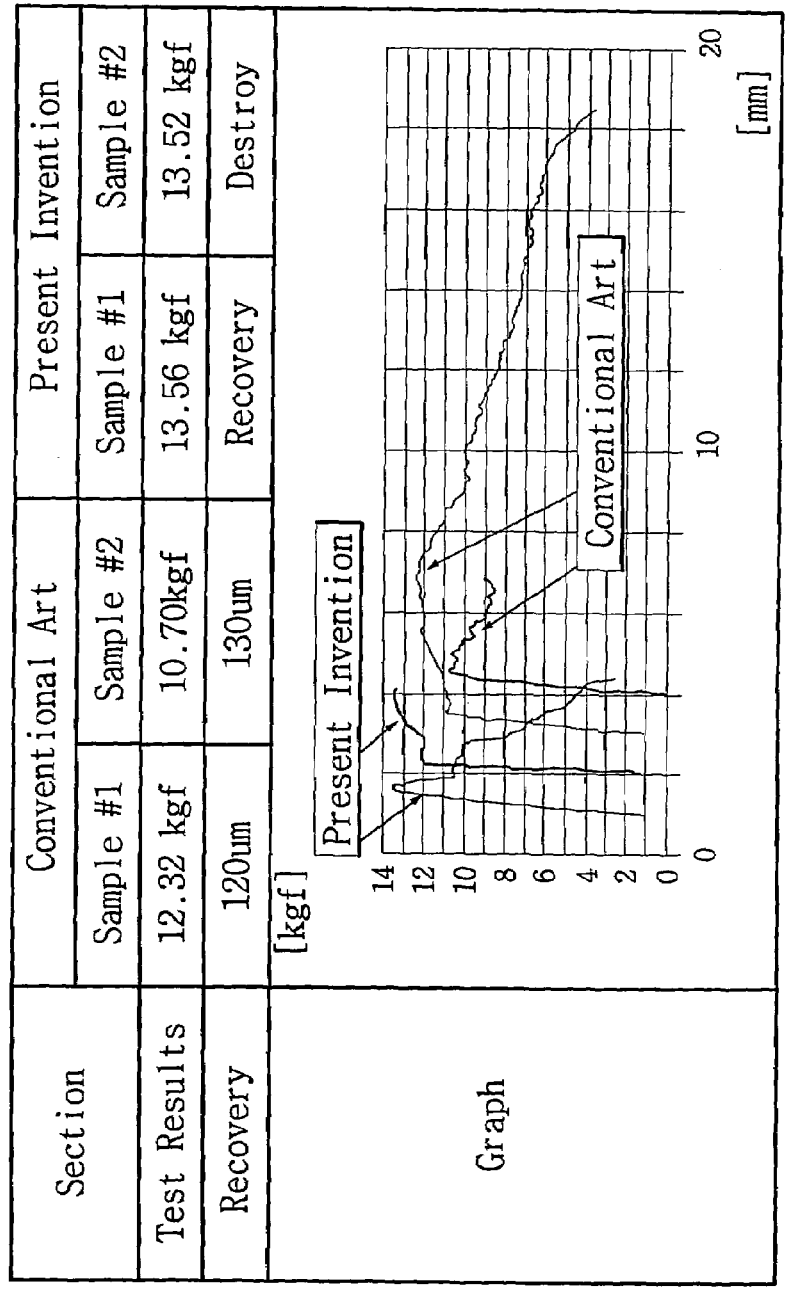
FIG. 5 is a table showing the results of tension testing for the connection structures of the prior art and the present invention.

FIG. 5 is a table showing the results of tension testing for the connection structures of the conventional art and the present invention.

Referring to FIG. 5, the tensile strength of the connection structure of circuit substrates of the present invention increases, in one case by approximately 20%, compared to that of the conventional connection structure.

Conventionally, the expansion of the adhesive tape may result in a gap between the circuit substrates, generating a transfer fault. Further, it is not easy to perceive such a gap with the naked eye. In accordance with the present invention, however, the connected portion may not expand, but may be destroyed at the yield strength. This allows an operator to perceive abnormality of the connected portion of the circuit substrates with the naked eye. In other words, the connection structure may maintain its original structure within the yield strength, reducing the generation of transfer faults during a reel-to-reel process.

Figure 6:
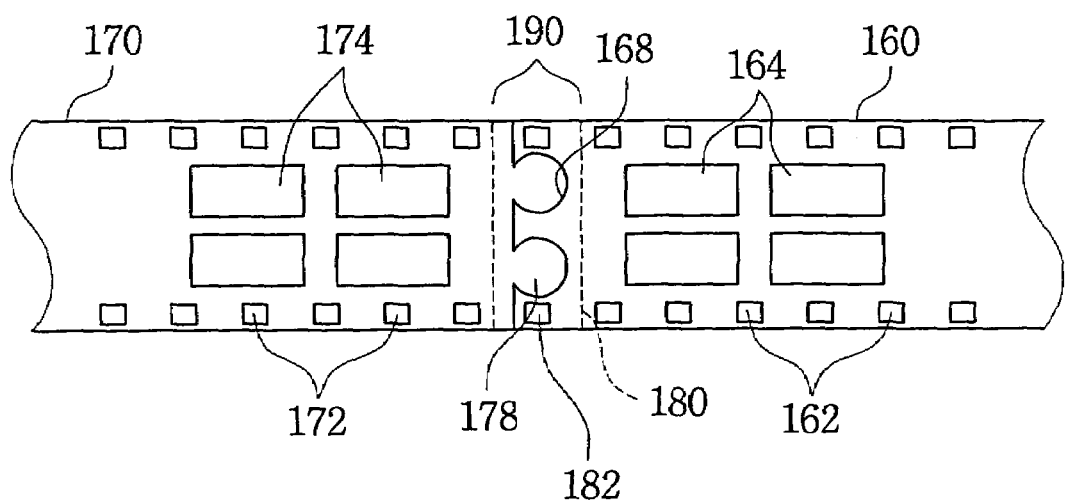
FIG. 6 is a plan view of a connection structure in accordance with another embodiment of the present invention.

Although this embodiment shows the concave and convex portions formed in the shape substantially of a "T", the concave and convex portions may be formed of various shapes. For example, as shown in FIG. 6, the concave and convex portions 168 and 178 may be formed in the shape substantially of an oval. The concave portion 178 is prefer- ably formed such that the inside width is larger than the entrance width and the center of the oval is located in the concave area.

Figure 7:
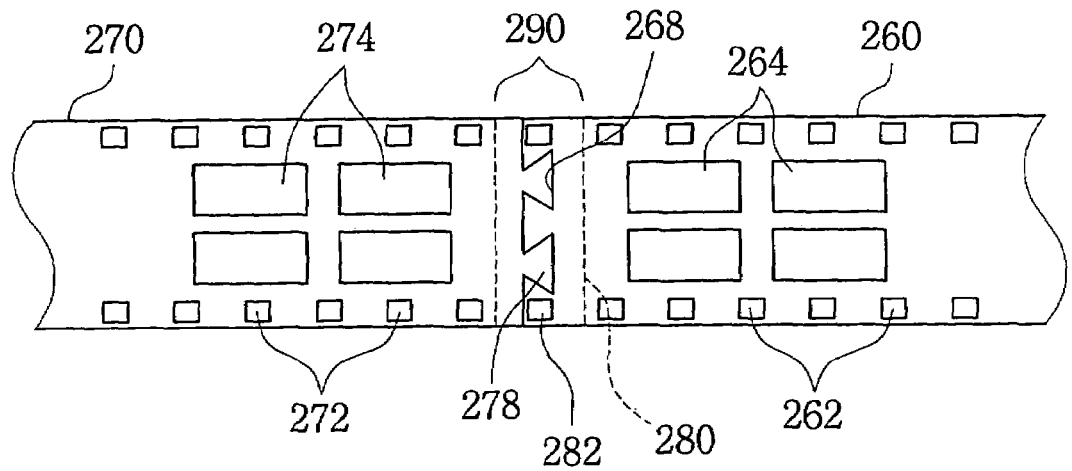
FIG. 7 is a plan view of a connection structure in accordance with yet another embodiment of the present invention.

Referring to FIG. 7, the concave and convex portions 268 and 278 may also be formed in the shape substantially of a trapezoid. The concave portion 268 is preferably formed such that the inside width is larger than the entrance width.

Accordingly, the convex portion 68, 168, 268 of the second circuit substrate 70, 170, 270 fits into the concave portion 78, 178, 278 of the first circuit substrate 60, 160, 260. The bonding strength of the connection structure may be provided by the connection structure itself as well as by the adhesive strength of the adhesive tape, improving the tensile strength of the connected portion of the circuit substrates.

Although the exemplary embodiments of the present invention have been described in detail hereinabove, it should be understood that many variations and/or modifications of the basic inventive concepts taught herein, which may appear to those skilled in the art, will still fall within the spirit and scope of the present invention as defined in the appended claims.

What is claimed is:

1. A connection structure for connecting circuit substrates comprising:
   a pre-formed first circuit substrate having at least one concave portion, wherein the first circuit substrate includes a plurality of first guide holes spaced apart from each other by a predetermined interval;
   a pre-formed second circuit substrate having at least one convex portion, wherein the second circuit substrate includes a plurality of second guide holes spaced apart from each other by the predetermined interval;
   the first circuit substrate concave portion connecting to the second circuit substrate convex portion in complementary attachment; and
   a dummy guide hole in the first circuit substrate adjacent to the at least one concave portion, wherein the dummy guide hole is spaced apart from one of the plurality of first guide holes and one of the plurality of second guide holes by the predetermined interval.

2. The structure of claim 1, wherein the concave and convex portions are substantially of "T" shape.

3. The structure of claim 1, wherein the concave and convex portions are substantially of oval shape.

4. The structure of claim 1, wherein the concave and convex portions are substantially of trapezoid shape.

5. The structure of claim 1, further comprising an adhesive tape to secure the connection of the first and second substrate.

6. The structure of claim 1, wherein the concave portion has an inside width larger than an entrance width.

7. The structure of claim 1, wherein the concave portion of the first circuit substrate interlocks with the convex portion of the second circuit substrate.

8. A semiconductor package connection structure comprising:
   a pre-formed first semiconductor substrate having a rear end, the rear end including at least one recessed concave portion, wherein the first semiconductor substrate includes a plurality of first guide holes spaced apart from each other by a predetermined interval;
   a pre-formed second semiconductor substrate having a front end, the front end including at least one protruding convex portion, wherein the protruding convex portion of the second semiconductor substrate corresponds in shape and size to the recessed concave portion of the first semiconductor substrate such that the rear end of the first semiconductor substrate is connected with the front end of the second semiconductor substrate and wherein the second semiconductor substrate includes a plurality of second guide holes spaced apart from each other by the predetermined interval;

a dummy guide hole in the first semiconductor substrate adjacent to the at least one concave portion, wherein the dummy guide hole is spaced apart from one of the plurality of first guide holes and one of the plurality of second guide holes by the predetermined interval; and an adhesive tape formed over the rear end of the first semiconductor substrate and front end of the second semiconductor substrate to secure the connection between the first and the second semiconductor substrate.

9. The structure of claim 8, wherein the concave and convex portions are substantially of "T" shape.

10. The structure of claim 8, wherein the concave and convex portions are substantially of oval shape.

11. The structure of claim 8, wherein the concave and convex portions are substantially of trapezoid shape.

12. The structure of claim 8, wherein the concave portion has an inside width larger than an entrance width.

13. The structure of claim 8, wherein the concave portion of the first circuit substrate interlocks with the convex portion of the second circuit substrate.

14. The structure of claim 1, wherein the at least one concave portion extends from an edge of the first circuit substrate into the first circuit substrate by a predetermined distance and wherein an edge of the dummy guide hole farthest away from the edge of the first circuit substrate is spaced apart from the edge of the first circuit substrate by a distance less than the predetermined distance.

* * * * *

UNITED STATES PATENT AND TRADEMARK OFFICE
CERTIFICATE OF CORRECTION

| | | |
|---|---|---|
| PATENT NO. | : 7,371,071 B2 | Page 1 of 1 |
| APPLICATION NO. | : 10/877752 | |
| DATED | : May 13, 2008 | |
| INVENTOR(S) | : Sung-Dae Cho et al. | |

It is certified that error appears in the above-identified patent and that said Letters Patent is hereby corrected as shown below:

Column 1, line 56, the word "ajam" should read -- a jam --.

Signed and Sealed this

Twenty-sixth Day of August, 2008

JON W. DUDAS
*Director of the United States Patent and Trademark Office*